(12) United States Patent
Chockler et al.

(10) Patent No.: US 8,996,339 B2
(45) Date of Patent: Mar. 31, 2015

(54) INCREMENTAL FORMAL VERIFICATION

(75) Inventors: Hana Chockler, Haifa (IL); Alexander Ivrii, Haifa (IL); Arie Matsliah, Haifa (IL); Shiri Moran, Kiryat Yivon (IL); Ziv Nevo, Yokneam (IL)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 13/226,513

(22) Filed: Sep. 7, 2011

(65) Prior Publication Data

US 2013/0060545 A1 Mar. 7, 2013

(51) Int. Cl.
*G06F 7/60* (2006.01)
*G06F 17/50* (2006.01)

(52) U.S. Cl.
CPC .................................. *G06F 17/504* (2013.01)
USPC ............... 703/2; 703/5; 703/21; 703/22

(58) Field of Classification Search
USPC ............................................. 703/2, 5, 21, 22
See application file for complete search history.

(56) References Cited

U.S. PATENT DOCUMENTS

| | | | |
|---|---|---|---|
| 5,926,622 A * | 7/1999 | Hardin et al. .................... 714/33 |
| 6,957,178 B2 | 10/2005 | Musliner et al. |
| 7,047,139 B2 | 5/2006 | Shtrichman |
| 7,281,225 B2 * | 10/2007 | Jain et al. ....................... 716/106 |
| 7,509,605 B2 | 3/2009 | Baumgartner et al. |
| 7,653,520 B2 | 1/2010 | De Moura et al. |
| 7,725,851 B2 * | 5/2010 | Eisner et al. ................... 716/106 |
| 7,779,378 B2 | 8/2010 | Baumgartner et al. |
| 2005/0188337 A1 | 8/2005 | Baumgartner et al. |
| 2007/0118340 A1 * | 5/2007 | Geist et al. ......................... 703/2 |
| 2008/0109201 A1 * | 5/2008 | Stergiou et al. .................. 703/13 |
| 2008/0229263 A1 | 9/2008 | Baumgartner et al. |
| 2009/0326886 A1 * | 12/2009 | Arbel et al. ........................ 703/6 |
| 2010/0257494 A1 | 10/2010 | Pouarz et al. |
| 2011/0010139 A1 * | 1/2011 | Fuhrmann et al. ................ 703/2 |

OTHER PUBLICATIONS

Aaron R. Bradley ("SAT-Based Model Checking Without Unrolling", VMCAI, Feb. 2011, pp. 1-17).*
Amla et al. ("An Analysis of SAT-Based Model Checking Techniques in an Industrial Environment", International Federation for Information Processing 2005, pp. 254-268).*
K.L. McMillan ("Interpolation and SAT-Based Model Checking", Springer-Verlag Berlin Heidelberg 2003, pp. 1-13).*
Zhang et al. ("Incremental Deductive & Inductive Reasoning for SAT-based Bounded Model Checking", IEEE, 2004, pp. 502-509).*
Kang et al. ("SAT-Based Unbounded Symbolic Model Checking", IEEE, 2005, pp. 129-140).*
Gitanjali Meher Swamy., "Incremental Methods for Formal Verification and Logic Synthesis",Doctoral Dissertation, University of California, Berkeley, 1996, ISBN:0-591-32212-9. Publisher: ACM.

(Continued)

*Primary Examiner* — Omar Fernandez Rivas
*Assistant Examiner* — Iftekhar Khan
(74) *Attorney, Agent, or Firm* — Ziv Glazberg

(57) ABSTRACT

Method, apparatus, and product for performing incremental formal verification. A computer-implemented method performed by a computerized device. The method comprises: obtaining invariants with respect to a first model; determining a portion of the invariants that are invariants with respect to a second model, and utilizing the portion of the invariants to check that the second model holds a property.

17 Claims, 3 Drawing Sheets

(56) References Cited

OTHER PUBLICATIONS

Mitra, S et al., "Incremental Verification Techniques for an Updated Architectural Specification", India Conference (INDICON), 2009 Annual IEEE, Date: Dec. 18-20, 2009. p. 1-4. Publisher: IEEE.

Y. Lakhnech et al. "Incremental Verification by Abstraction", Tools and Algorithms for the Construction and Analysis of Systems, Lecture Notes in Computer Science, 2001, vol. 2031/2001, 98-112, DOI: 10.1007/3-540-45319-9_8.

Wolfgang Reif and Kurt Stenzel., "Reuse of proofs in software verification", Foundations of Software Technology and Theoretical Computer Science, Lecture Notes in Computer Science, 1993, vol. 761/1993, 284-293, DOI: 10.1007/3-540-57529-4_61.

Aaron R. Bradley., "k-Step Relative Inductive Generalization", CoRR abs/1003.3649, 2010.

* cited by examiner

INCREMENTAL FORMAL VERIFICATION

TECHNICAL FIELD

The present disclosure relates to formal verification in general, and to formal verification of similar models or properties as were verified before, in particular.

BACKGROUND

State of the art computerized components are complex and require extensive quality assurance checks. One of the commonly used techniques is formal verification in which the computerized component is modeled and is examined by a model checker. A verification query comprises a model and a property, wherein the model is to be checked whether it holds the property or there exists a behavior of the model that refutes the property. The model describes all possible behaviors of the computerized component based on inputs from the environment and calculations performed by the computerized component itself. Most components are represented by cycled models in which the state of the component may differ from one cycle to the other. It will be noted that the computerized component may be a software component, firmware component, hardware component or the like. It will be further noted that in some cases the component to be verified may be a business method, user interaction, communication protocol or any other form of activity or computation that may be expressed formally using a model.

A model checker checks that the model holds a predetermined specification property. An exemplary specification property may be that a triggered event is always handled by the component or that a certain variable is never assigned a predetermined value. The specification property may be attributed to one or more cycles, such as for example, after a flag is raised in a cycle, an alert is issued within a predetermined number of cycles. In some exemplary embodiments, the property may be any property such as safety property or liveness property, and may be provided using a Property Specification Language (PSL) formula such as AGp, indicating that Always (i.e., in each cycle), Globally (i.e. in each possible scenario), property p holds. Property p may be a property provided in temporal logic.

Model checkers may be symbolic model checkers, explicit model checkers, or the like. The model checker may utilize a Boolean Satisfiability problem (SAT) solver, and known as SAT-based model checkers, such as for example a Bounded Model Checker (BMC), Interpolant-based Transition Relation approximation, or the like. One form of SAT-based model checkers are model checkers that do not unroll the transition relation of the model. One such model checker is described in A. R. Bradley, "SAT-based model checking without unrolling," in Verification, Model Checking, and Abstract Interpretation (VMCAI' 11), 2011, pp. 70-87 (hereinafter: "Bradley"), which is hereby incorporated by reference. Additionally or alternatively, model checkers may be Binary Decision Diagrams (BDD)-based model checker.

Some model checkers are adapted to generate invariants of the model useful for the verification that the property is held. Invariants, also referred to as invars, may be useful in gaining a speed-up in model checking, enabling model checking of a previously unfeasible verification query. Invars may or may not be property-directed.

BRIEF SUMMARY

One exemplary embodiment of the disclosed subject matter is a computer-implemented method performed by a computerized device. The method comprising: obtaining invariants with respect to a first model; determining a portion of the invariants that are invariants with respect to a second model; and utilizing the portion of the invariants to check that the second model holds a property.

Another exemplary embodiment of the disclosed subject matter is an apparatus, having a processing unit. The apparatus comprising an invariant obtainer operative to obtain invariants with respect to a first model. The apparatus further comprising an invariant verifier operative to determining a portion of the invariants that are invariants with respect to a second model. The apparatus further comprising a model checker operative to model check that the second model holds a property, wherein the model checker is operative to utilize the portion of the invariants determined by the invariant verifier.

Yet another exemplary embodiment of the disclosed subject matter is a computer program product comprising: a non-transitory computer readable medium; a first program instruction for obtaining invariants with respect to a first model; a second program instruction for determining a portion of the invariants that are invariants with respect to a second model; a third program instruction for utilizing the portion of the invariants to check that the second model holds a property; and wherein the first, second, and third program instructions are stored on the non-transitory computer readable medium.

BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

Figure 1:
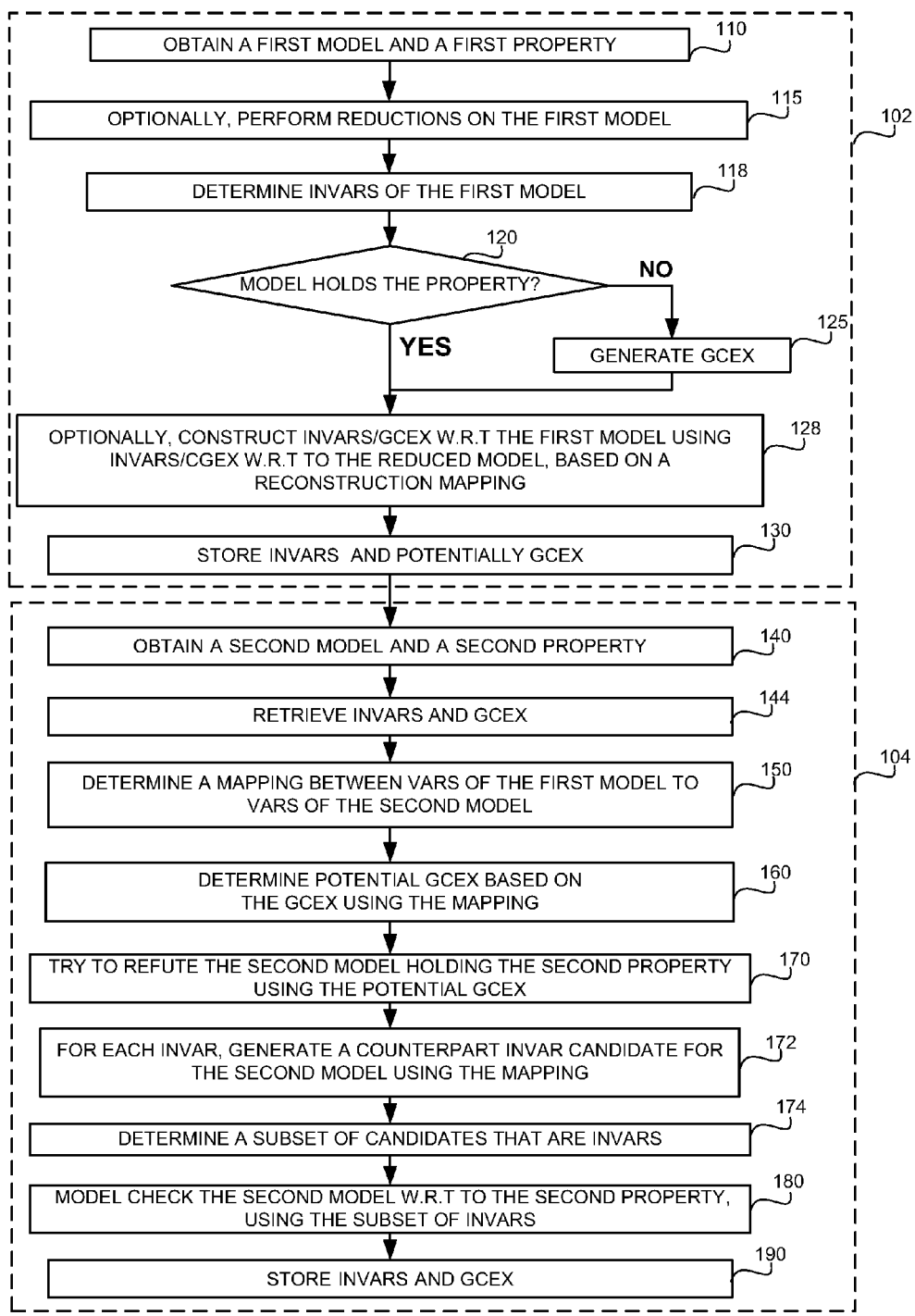
FIG. 1 shows a flowchart diagram of steps in a method for performing incremental verification, in accordance with some exemplary embodiments of the disclosed subject matter.

The disclosed subject matter is described below with reference to flowchart illustrations and/or block diagrams of methods, apparatus (systems) and computer program products according to embodiments of the subject matter. It will be understood that blocks of the flowchart illustrations and/or block diagrams, and combinations of blocks in the flowchart illustrations and/or block diagrams, can be implemented by computer program instructions. These computer program instructions may be provided to one or more processors of a general purpose computer, special purpose computer, a tested processor, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transient computer-readable medium that can direct a computer or other programmable data processing apparatus to function in a particular manner, such that the instructions stored in the non-transient computer-readable medium produce an article of manufacture including instruction means which implement the function/act specified in the flowchart and/or block diagram block or blocks.

The computer program instructions may also be loaded onto a device. A computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

It will be understood that though the disclosure focuses on formal verification of hardware designs, the disclosed subject matter is not limited to hardware designs and is applicable to any form of model.

In the present disclosure, a model defines a set of variables. Assignments of values to the variables defines a state of the model at a specific cycle. It will be understood that in some cases, signals provided as input to the model do not define the state of the model, but may effect a change to the behavior of the next cycle. For simplicity, we refer to signals as variables as well.

Formal verification has a high complexity and requires significant computational efforts, even for moderately sized designs. Moreover, when small changes are introduced, either on the design, its environment (e.g., driver providing input or modeling of input provided to the design), or the property being verified, the whole verification process has to be re-executed, thus consuming the same amount of resources as the first time. This may manifest in regression verification, where a new version of the design has to be re-verified usually with respect to the same (or very similar) properties and environment.

One technical problem dealt with by the disclosed subject matter is to reduce verification time of similar verification queries, such as in regression verification. In some cases, the previous verification query has passed and in some it has failed. The disclosed subject matter addresses both cases.

In some exemplary embodiments, it may be more common in regression verification that the first model was correct with respect to the property, and that the second model is checked against a similar property.

Another technical problem is to identify relevant portions of the data determined by the model checker with respect to the first verification query and reuse it for performing a second verification query.

Yet another technical problem is to provide a sound method, such that for any two verification queries the data may be stored and reevaluated, such that if the data is not relevant it will not jeopardize the correctness of the verification process. In some exemplary embodiments, the first and the second verification queries may comprise revised models of one another, may comprise the same model checked with respect to different properties or using different environment modeling, may be totally unconnected, or the like, and still the verification of the second model would provide the correct result.

One technical solution is to determine invars with respect to the first model and reuse the invars with respect to the second model. As the invars of the first model are not necessarily invars of the second model, they may be treated as invar candidates and checked for correctness on the second model.

In some exemplary embodiments, invars may be a part of the proof of correctness of the property. In some exemplary embodiments, the proof is based on invars, such that the set of invars, S, implies that at the next state, the property is held. The invars of the proof are saved and may be reused later to reproduce the proof on a modified model.

In some exemplary embodiments, in case the same proof does not apply, a useable portion of the proof may be reused as a basis for a new proof. For example, is the set of invars S does not apply to the second model, a subset S' may apply. The set S'' which comprises S' may be a proof for the second model. Reusing the subset S' as a basis for the proof may reduce computational resources in model checking the second model. Preferably, a maximum portion of the proof is reused.

Another technical solution is to reuse a counter-example exemplifying that the property is not held by the first model. In some exemplary embodiments, a generalized counter-example (GCEX) may be provided or computed. The GCEX represents a set of counter-examples that refute the property. GCEX comprises K partial assignments to variables of the model, representing K consecutive cycles of the model, starting from the initial state, that refute the property. In some exemplary embodiments, the GCEX comprises a sequence a0, a1, . . . ak of partial assignments to the set of variables of the model (e.g., registers of the design). All a0 states are init states. All ai states lead to some a(i+1) state. All ak states refute the property.

In some exemplary embodiments, the GCEX is stored and when the second model is checked for holding the property, the GCEX may be used as a potential counter-example to be checked.

Yet another technical solution is to determine a mapping between variables of the first model to variables of the second mapping. In some exemplary embodiments, the mapping may be based on labels of the variables, on user-input, on a defined behavior of the variables (e.g., netlists assigned to each variable), or the like.

In some exemplary embodiments, the invars and/or GCEX may be based on reduced model, and a reconstruction mapping may be used to determine their equivalents with respect to the original, unreduced, model. In some exemplary embodiments, reductions may be change names of variables of the model, may remove duplicative variables, unify different variables or combinatorial logics, or the like. Reconstruction mappings may be utilized for "trace lifting", to determine a counter-example for the original model based on a counter-example of the reduced model. The same mapping may be utilized for "proof lifting"—determining a corresponding proof based on the proof of the reduced model.

One technical effect of utilizing the disclosed subject matter is to provide a speedup when verifying similar models or properties. It will be noted that in some cases, it is sufficient that the models may be similar in a portion relevant to the property, and may thus be generally dissimilar, and yet benefit from the disclosed subject matter.

An invariant may be useful in proving that a property is held. In some exemplary embodiments, a model checker may gain a significant performance speedup when proving the property and utilizing one or more invariants. In some exemplary embodiments, proving the property may become feasible due to the utilization of the invariants. Thus, invariants may be useful to overcome state-space explosion problem in some cases. Therefore, reusing invariants may be useful in providing speedup or overcoming state-space explosion problem.

In experimental results performed by Applicants, speedup of average 10× is achieved when re-verifying the same property over the same model having a minor modification introduced to it.

Another technical effect is to provide for efficient incremental process of formal verification. A modified model may be verified with respect to the same property or a similar property, using byproducts of the verification of the original model.

Yet another technical effect is that saving of data does not require any significant overhead, as the saved part may be relatively small and is computed during the verification process. In some exemplary embodiments, GCEX can be representing using less data than a concrete, non-generalized, counter-example.

Yet another technical effect is that the disclosed subject matter can also be used to efficiently compute formal coverage which studies the influence of small mutations of the design on the result of verification.

Referring now to FIG. 1 showing a flowchart diagram of steps in a method for incremental verification, in accordance with some exemplary embodiments of the disclosed subject matter.

The disclosed subject matter relates to a model. The model may be a descriptive model of operation of a computerized device, such as a hardware or software component. In some exemplary embodiments, the model may describe operation of a communication protocol, business method or the like. In some exemplary embodiments, the model describe states in discrete cycles, such as for example, clocking cycles of a CPU, turns in a communication protocol, or the like. In some exemplary embodiments, the model may be unbounded, such that it may describe a state after any number of cycles.

In some exemplary embodiments, a state of the model may be defined using a set of variables. A transition relation may define a change from a cycle to a next cycle, based on the current state and the input. A set of one or more initial states may be provided defining potential initial states of the model. In some exemplary embodiments, the model may be depicted using a descriptive language such as SystemC, Hardware Description Language (HDL), Verilog, Property Specification Language (PSL) or the like.

Step 102 is a verification of first verification query. Step 104 is a verification of a second verification query using saved information from the first verification instance. In some exemplary embodiments, additional verification instances may follow step 104 in a similar manner.

In step 110, a first model and a first property are obtained, as part of a first verification query to be checked. In some exemplary embodiments, the user may provide the model and property.

Optionally, in step 115 reductions are performed on the model to provide a reduced model. The reductions may be, for example, cone of influence reduction, partial order reduction, symmetry reduction, constant propagation, SAT/BDD sweeping and the like. In case a reduce model is determined, steps 118-125 are performed with respect to it instead of the unreduced first model.

In step 118, invars of the first model are determined. In some exemplary embodiments, the invars are determined based on a simulated-execution of the model. In some exemplary embodiments, the invars are property-driven, such as determined by Bradley. In some exemplary embodiments, the invars are a byproduct of performing model checking of step 120, such as in the case of Bradley, in case of interpolation SAT-based model checking, such as described in Kenneth McMillan "Interpolation and SAT-Based Model Checking", CAV 2003, which is hereby incorporated by reference, in a method of proving invariants by induction, or the like.

In some exemplary embodiments, the model checker performing steps 118-120 may be a SAT-based model checker that checks the property without unrolling the cycles of the model, as opposed to the method of BMC. One such model checker is described in Bradley. Such model checker may be adapted to utilize invariants to determine whether a property is always held.

In step 120, the first model is checked with respect to the property. If the model holds the property, a proof may be generated, such as a proof of unsatisfiability in BMC, a set of invars in Bradley, or the like. If the model does not hold the property, step 125 is performed, and a counter example may be produced. In some exemplary embodiments, the counter-example may be a GCEX. Optionally, a concrete counter-example may be broadened into a GCEX by omitting assignments to variables which do not affect the variables that the property refers so (i.e., variables whose cone of influence does not comprise variables that the property examines).

Optionally, step 128 may construct invars that refer to the first model, based on the invars that were determined in step 118 and refer to a reduced model. Similarly, GCEX suitable to the first model may be constructed. Construction of the invars and/or GCEX may be performed based on a reconstruction map, such as determined during the reductions of step 115.

In step 130, the invars may be stored for usage on another model, later on. Similarly, GCEX may be stored. The data may be stored on a computer-readable medium, preferably persistent storage, such as a Network-Associated Storage (NAS), Storage Area Network (SAN), a Flash drive, a Hard disk, or the like. In some exemplary embodiments, a determination whether or not to store may be based on user input, such as provided by user preferences. In some cases, the user may decide not to use an incremental aspect of the disclosed subject matter.

Step 104 comprises a second verification query which may be performed some time after the first verification query of step 102. In some exemplary embodiments, it may be performed by a different user and potentially by a different computerized device.

In step 140, a second model and a second property are obtained, as part of the second verification query to be checked, similarly to step 110. In some exemplary embodiments, the second model may be a similar model to the first model, a refinement or modification thereof, or the like. In some exemplary embodiments, the second model may be the same as the first model. Similarly, the second property may be the same as the first property, or a similar property that is different than the first property due to the differences between the models. However, it will be noted that the disclosed subject matter is applicable for any two models and any two properties even if they are unrelated, though that in such a case it is less likely that the disclosed subject matter may increase efficiency of the verification process.

In step 144, invars and GCEX stored in step 130 may be retrieved from storage for reuse in the second verification query. In some exemplary embodiments, GCEX may be utilized only in case the first and second property are somehow related (e.g., the same property, a similar property with a minor modification, a property checking a similar aspect of the model, or the like).

In step 150, a mapping between variables of the first model and variables of the second model may be determined Mapping of variables may be arbitrary. In some exemplary embodiments, the mapping may be based on labeling of the variables, where variables having the same or similar name tags may be linked. In some exemplary embodiments, semantic aspects of the variables may be utilized in linking variables of the different models. For example, structure of netlists associated with variables may be compared to determine some correlation. Other combinatorial logic structures, in addition to netlists, may be utilized. In some exemplary embodiments, mapping may be, at least in part, based on user input, such as customized mapping provided by the user. In some exemplary embodiments, mapping may be based on similarity between Next State Functions (NSF) and/or initial signals (INIT) of variables. For example, mapping may be based on a comparison of signatures of NSF and INIT driving netlists.

In some exemplary embodiments, mapping may be between unreduced models. In case the second model is reduced using reductions (not shown), the reconstruction mapping may be utilized, in combination with the mapping to map between variables of the first model and the second model. For example, variables of the first model may be mapped, based on the mapping, to variables of the second (unreduced) model. Those variables may be mapped, based on the reconstruction mapping, to variables of the reduced second model.

In step 160, a potential GCEX may be determined for the second model based on the GCEX of the second model. Optionally, step 158 may be omitted if the property refuted by the GCEX is substantially different than the second property. The potential GCEX may be determined using the mapping by mapping each variable appearing in the GCEX with a corresponding variable of the second model based on the mapping. For example, if the GCEX is $a_0=(x=0, y=1, z=1)$, $a_1=(x=1, y=1, w=5)$, $a_2=(x=0, y=0)$, then the potential GCEX may be $a_0=(a=0, b=1, c=1)$, $a_1=(a=1, b=1, d=5)$, $a_2=(a=0, b=0)$, based on the mapping x=>a, y=>b, z=>c, w=>d.

In step 170, the potential GCEX may be utilized in an attempt to refute that the second model holds the second property. In some exemplary embodiments, a SAT solver may be utilized in this step. In some exemplary embodiments, a SAT solver may be utilized to check if there is at least one counter-example in the second model based on the potential GCEX. In some exemplary embodiments, for each cycle in the potential GCEX a SAT call may be utilized. With respect to $a_0$ the SAT call may check that there is a satisfying assignment of the second model such that the initial cycle comprises the partial assignments of $a_0$. The SAT solver may be provided with a CNF corresponding to: $a_0 \wedge I$, where I is the initial axiom of the second model. Similarly, for each cycle i, a SAT check that there is a satisfying assignment that holds: $a_i \wedge TR \wedge a_{i+1}'$, where $a_i$ is the partial assignment to a first cycle and $a_{i+1}'$ is the partial assignment to a next cycle, and TR is the transition relation, a SAT check may be performed to check that there exists a satisfying assignment such that $a_k \wedge \neg p$, where $a_k$ is the partial assignment of the last cycle and p is the second property. In some exemplary embodiments, a single SAT call may be utilized, while unrolling the model to k cycles. The single SAT call may assign values in accordance with the potential GCEX, conjunct initial axiom on the initial cycle and a transition relation for each pair of consecutive cycles, and a negation of the second property for the last cycle.

A person of ordinary skill in the art may appreciate that it may happen that the exact same CEX that was extracted for the original model is not consistent with the second model. However, the GCEX may still be extendable to a different concrete counter-example for the second model.

In case the there is a determination that the second property is not held by the second model, the method may provide an appropriate output to the user. Optionally, step 190 may be performed to store the GCEX. Otherwise, the method may continue.

In some exemplary embodiments, steps 160-170 may be optional. In some exemplary embodiments, steps 160-170 may utilize the invariants as determined in step 174 below.

In step 172, for each invar of the first model, a counterpart invar candidate may be generated based on the mapping. For example, if the invar is $x=y \rightarrow next(y' \neq x')$ and x is mapped to a, and y is mapped to b, the generated candidate may be $a=b \rightarrow next(b' \neq a')$.

In step 174, a subset of invars is determined out of the counterpart invar candidates. The subset of invars may be determined using an inductive proof. In some exemplary embodiments, an inductive proof of $TR \wedge S \rightarrow S'$ with respect to a subset S of the candidates is determined and a transition relation TR of the model. Initially, S comprises all invariant candidates, and after a refutation of the inductive step, each candidate that is not held is removed from S. Optionally, a SAT solver may be utilized to determine a satisfying assignment to a Conjunctive Normal Form (CNF) formula corresponding to $TR \wedge S \rightarrow \neg S'$. A satisfying assignment shows that at least one invariant candidate is not an invariant with respect to the second model. Determining invariants out of a set of invariants may be performed based on the method described in U.S. patent application Ser. No. 13/195,876, entitled "DETERMINING INVARIANTS IN A MODEL", filed on 2 Aug. 2011, which is hereby incorporated by reference. The disclosed subject matter is not limited to this method of the determining whether a candidate is an invariant, and other methods may be applied instead.

In step 180, the second model may be checked whether it holds the second property. The model checking may be performed using the subset of invars determined in step 156. In some exemplary embodiments, it may be checked whether the subset of invars implies the second property on the second model. If so, the subset of invars may be deemed as a proof that the second model holds the second property. Otherwise, the subset of invars may be utilized as part of the model checking process.

In some exemplary embodiments, a model checker that is adapted to model check a model by determining invars and utilizing them, such as the model checker described in Bradley, may be provided the subset of invars as a starting point in its execution. Additionally or alternatively, any model checker may be utilized to check the second model using the invars, such as by introducing the invars to the second model.

The model checker utilized in step 180 may provide a counter-example in case the second property is not held by the second model. Optionally, a GCEX is determined, either directly by the model checker, or based on a concrete counter-example.

In step 190, invars of the second model and/or GCEX of the second model with respect to the second property may be stored. Step 190 may be similar to step 130. The information stored instep 190 may be useful to a verification step of a third verification query, similarly to step 104.

Figure 2:
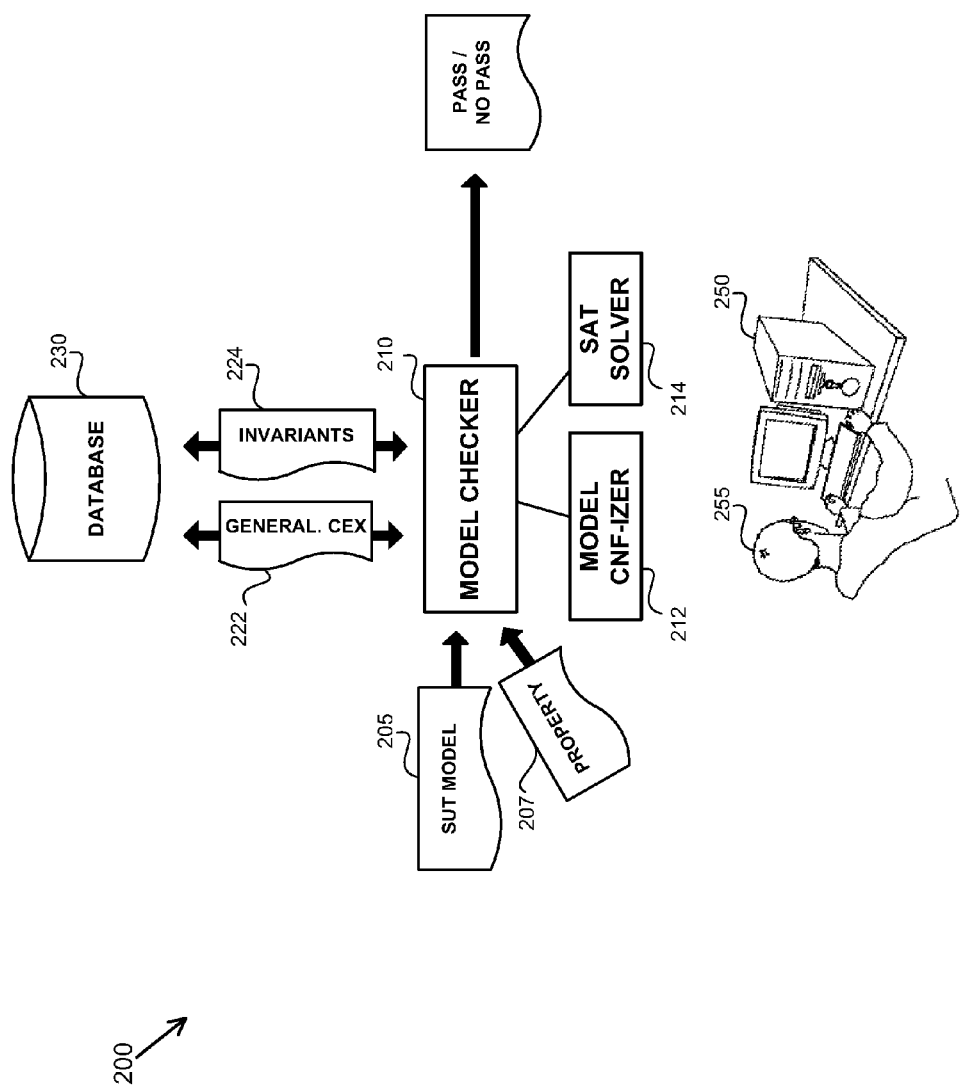
FIG. 2 shows a diagram of a computerized environment, in accordance with some exemplary embodiments of the disclosed subject matter.

Referring now to FIG. 2 showing a diagram of a computerized environment 200, in accordance with some exemplary embodiments of the disclosed subject matter.

A model 205 of a System Under Test (SUT) may be provided to the computerized environment, such as prepared by a verification engineer, a specification designer, or the like.

The model may comprise initial axiom and/or transition relation axiom. The model may define variables useful for indicating a state of the SUT in a given cycle. The transition relation axiom may be useful to describe a next state of the SUT based on a current state and/or input signals.

A property 207 may be provided as well. The property 207 may be provided in a formal language, such as PSL.

A model checker may be an apparatus, implemented in hardware, software, firmware, combination thereof or the like, adapted to determine whether the model 205 holds the property 207. The model checker 210 may be a BDD-based model checker, a SAT-based model checker, an explicit model checker, a symbolic model checker, or the like. The model checker 210 may provide an output of PASS/NO PASS. Optionally, a proof of passing (e.g., inductive proof, proof of unsatisfiability, a set of invars proving the property, or the like) may be provided in case of a PASS. Optionally, a counter-example—either GCEX or concrete counter-example—may be provided in case of a NO PASS.

The model checker 210 may utilize a SAT solver 214. The SAT solver 214 may be an apparatus, implemented in hardware, software, firmware, combination thereof, or the like, operative to determine a satisfying assignment of a Boolean satisfiability problem, or, alternatively, indicate that no such satisfying assignment exists. In some exemplary embodiments, the SAT solver may be, as a non-limiting example, Chaff, disclosed in Matthew W. Moskewicz, et al, "Chaff: engineering an efficient SAT solver", Proceedings of the 38th conference on Design automation, p. 530-535, 2001, which is hereby incorporated by reference, MiniSat, disclosed in Niklas Een et al, "An Extensible SAT-solver", SAT 2003, which is hereby incorporated by reference, or the like. In some exemplary embodiments, a SAT solver may implement the Davis-Putnam-Logemann-Loveland algorithm (DPLL) algorithm, or the like.

In some exemplary embodiments, the model checker 210 may utilize a model CNF-izer 212. The model CNF-izier 212 may be an apparatus, implemented in hardware, software, firmware, combination thereof, or the like, operative to transform the model 205 into a CNF formula useful to the SAT solver 214. The model CNF-izer 212 may be operative to unroll the model to a bounded number of cycles, such as useful for BMC. The model CNF-izer 212 may be operative to avoid unrolling the model, thereby providing the SAT solver 214 with a behavior of the model 205 from a state to a next state. Optionally, the state may be set to be any initial state using an initial axiom of the model 205. In some exemplary embodiments, a model checker such as described in Bradley may utilize a model CNF-izer 212 operative to avoid unrolling the model.

In some exemplary embodiments, the model checker 210 may be adapted to determine invariants 224 of the model 205. The model checker 210 may store determined invariants to a data storage 230. In case of an incremental operation (e.g., with respect to a similar model, similar property, regression verification, or an indication by the user) the model checker 210 may utilize the invariants 224 for model checking another model. Utilization of the invariants 224 may be in accordance with the method of FIG. 1.

In some exemplary embodiments, the model checker 210 may utilize a previously stored GCEX 222, such as disclosed hereinabove. In response to a NO PASS determination, the model checker 210 may store the GCEX 222 for usage in the future.

Optionally, invariants 224 and/or GCEX 222 may be stored together with the model 205, so that mapping between the model 205 and a new model may be determined Optionally, only portions of the model 205 that are referred to by the invariants 224 and/or GCEX 222 may be stored. Optionally, there may be a plurality of invariants and/or GCEXs stored in the data storage 230. Based on the model 205 and/or property 207, the model checker 210 may obtain invariants 224 and/or GCEX 222 form the plurality of stored invariants and GCEXs based on a random choice, a heuristic choice, an indication by the user, or the like. In some exemplary embodiments, invariants 224 and/or GCEX 222 are stored with respect to a verification query. A similarity criteria between the current verification query provided to the model checker 210 (i.e., model 205 and property 207) and each verification query of stored information may be computed, and invariants and/or GCEX of a best matching verification query may be obtained and utilized.

In some exemplary embodiments, data storage 230 may be persistent or volatile. For example, the data storage 230 can be a Flash disk, a Random Access Memory (RAM), a memory chip, an optical storage device such as a CD, a DVD, or a laser disk; a magnetic storage device such as a tape, a hard disk, storage area network (SAN), a network attached storage (NAS), or others; a semiconductor storage device such as Flash device, memory stick, or the like.

A user 255 may utilize a Man-Machine Interface (MMI) 250 to interact with the computerized environment 200. The computerized environment 200 may comprise of one or more computerized devices functioning as the different components thereof. The user 255 may utilize the MMI 250 to provide input, such as the SUT model 205, the property 207, commands, and preferences to the computerized environment 200 or any component thereof. The user 255 may use the MMI 250 to review output and receive notifications by the computerized environment 200.

Figure 3:
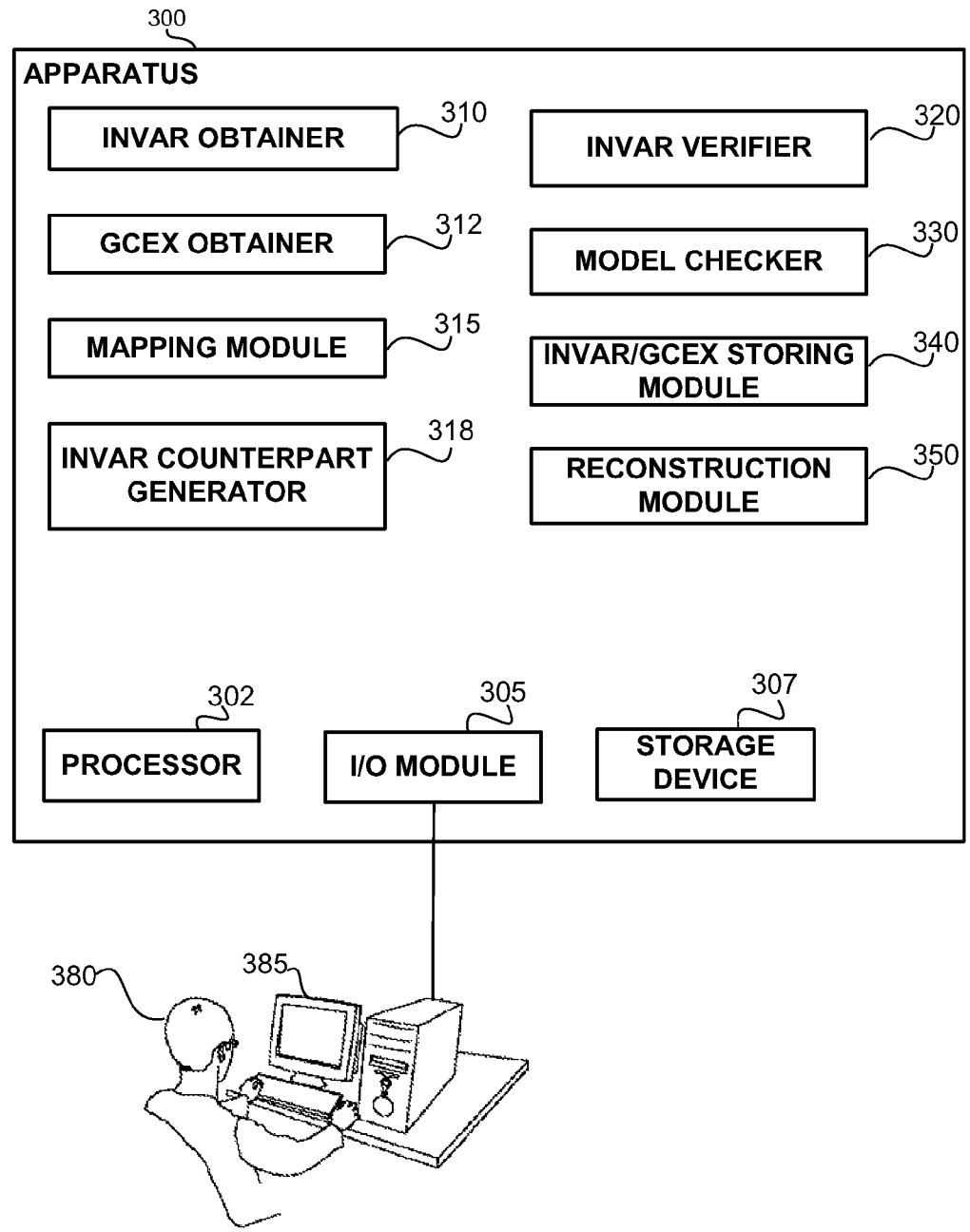
FIG. 3 shows a block diagram of components of an apparatus useful for incremental verification, in accordance with some exemplary embodiments of the disclosed subject matter.

Referring now to FIG. 3 showing a block diagram of components of an apparatus useful for incremental verification, in accordance with some exemplary embodiments of the disclosed subject matter. An apparatus 300 may be a computerized apparatus adapted to perform a method such as depicted in FIG. 1.

In some exemplary embodiments, apparatus 300 may comprise a processor 302. The processor 302 may be a Central Processing Unit (CPU), a microprocessor, an electronic circuit, an Integrated Circuit (IC) or the like. Alternatively, the apparatus 300 can be implemented as firmware written for or ported to a specific processor such as Digital Signal Processor (DSP) or microcontrollers, or can be implemented as hardware or configurable hardware such as field programmable gate array (FPGA) or application specific integrated circuit (ASIC). The processor 302 may be utilized to perform computations required by the apparatus 300 or any of it subcomponents.

In some exemplary embodiments of the disclosed subject matter, the apparatus 300 may comprise an Input/Output (I/O) device 305 such as a terminal, a display, a keyboard, an input device or the like to interact with the system, to invoke the system and to receive results. It will however be appreciated that the system can operate without human operation.

In some exemplary embodiments, the I/O module 305 may be utilized to provide an interface to a user 380, such as 255, which may utilize an MMI 385, such as 250, to interact with the apparatus 300, such as by reviewing results, logs and the like, providing commands, rules, preferences, formulas or the like, or interacting in any similar manner.

Additionally or alternatively, the I/O module 305 may be utilized to interface to a SAT solver (not shown). The SAT solver may be a third-party SAT solver used as a black-box, an off-the-shelf SAT solver, a specialized SAT solver, or the like.

In some exemplary embodiments, apparatus 300 may comprise a storage device 307. The storage device 307 may be persistent or volatile. For example, the storage device 307 can be a Flash disk, a Random Access Memory (RAM), a memory chip, an optical storage device such as a CD, a DVD, or a laser disk; a magnetic storage device such as a tape, a hard disk, storage area network (SAN), a network attached storage (NAS), or others; a semiconductor storage device such as Flash device, memory stick, or the like. In some exemplary embodiments, the storage device 307 may retain program code operative to cause the processor 302 to perform acts associated with any of the steps shown in FIG. 1 above.

The components detailed below may be implemented as one or more sets of interrelated computer instructions, executed for example by the processor 302 or by another processor. The components may be arranged as one or more executable files, dynamic libraries, static libraries, methods, functions, services, or the like, programmed in any programming language and under any computing environment.

An invar obtainer 310 may be configured to obtain a set of invars with respect to a model. In some exemplary embodiments, the invar obtainer 310 may obtain the set of invars from a data storage, such as 230. In some exemplary embodiments, the invars are with respect to a previously verified verification query. In some exemplary embodiments, the invar obtainer 310 may be operable to perform a step such as 144 of FIG. 1.

A GCEX obtainer 312 may be operable to obtain a GCEX refuting a model holding a property. The GCEX may be generated with respect to a previously refuted verification query. In some exemplary embodiments, the GCEX obtainer 312 may be operable to perform a step such as 144 of FIG. 1.

In some exemplary embodiments, the invar obtainer 310 and/or GCEX obtainer 312 may be configured to obtain a suitable set of invars and/or GCEX based on similarity of the previously performed verification query and a current verification query. Optionally, similarity may be determined based on a similarity of the properties examined. For example, if the same model was verified against ten different properties, a modified version of the model may be verified, during regression verification, against the ten properties and with respect to each property a different set of information (e.g., invars, GCEX) from a previously performed verification may be obtained. In some exemplary embodiments, for each property, the information stored after verifying the original model for holding the property may be obtained.

A mapping module 315 may be a operative to determine a mapping between variables of two models. The two models may be a previously verified model for which the invars and/or GCEX were obtained by the invar obtainer 310 and the GCEX obtainer 312, and a currently verified model. The mapping module 315 may be operative to perform step 148 of FIG. 1.

An invar counterpart generator 318 may be operative to generate counterpart invar candidates with respect to the model based on an invar obtained by the invar obtainer 310 and the mapping determined by the mapping module 315. In some exemplary embodiments, the invar counterpart generator 318 may be operative to perform step 152 of FIG. 1.

An invar verifier 320 may be operative to determine a subset of invars based on a set of counterpart invar candidates determined by the invar counterpart generator 318. In some exemplary embodiments, the invar counterpart generator 318 may be operative to perform step 156 of FIG. 1.

A model checker 330, such as 210 of FIG. 2, may be operative to model check that a model holds a property. The model checker 330 may be operative to utilize invars for model checking. Additionally or alternatively, the model checker 330 may be operative to produce, as a byproduct, invars of the model being checked. Additionally or alternatively, the model checker 330 may be operative utilize a SAT solver, and optionally avoid unrolling the model, but rather use a single transition relation from a cycle to a next cycle.

An invar/GCEX storing module 340 may be operative to store verification information determined by the model checker 330, such as invars of the model and/or GCEX. the storing module 340 may be operative to performed step 190 of FIG. 1.

A reconstruction module 350 may be operative to determine invars of a model based on invars of a version of the model after performing one or more reductions on the model. The reconstruction module 350 may be operative to utilize a reconstruction mapping. The reconstruction module 350 may be operative to reconstruct a counter-example (GCEX or concrete) for the model based on a counter-example of the reduced version of the model. The reconstruction module 350 may be operative to perform step 128 of FIG. 1.

Referring now to FIG. 4 showing an illustration of a mapping from a first model to a second model, in accordance with some exemplary embodiments of the disclosed subject matter.

The flowchart and block diagrams in the figures illustrate the architecture, functionality, and operation of possible implementations of systems, methods and computer program products according to various embodiments of the present disclosure. In this regard, each block in the flowchart and some of the blocks in the block diagrams may represent a module, segment, or portion of program code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", an and the are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one skilled in the art, the disclosed subject matter may be embodied as a system, method or computer program product. Accordingly, the disclosed subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, any non-transitory computer-readable medium, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, and the like.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A computer-implemented method performed by a computerized device, comprising:
    obtaining invariants with respect to a first unbounded model, wherein the invariants are determined based on the first unbounded model;
    determining a portion of the invariants that are invariants with respect to a second model;
    mapping variables of the first unbounded model that are comprised by the invariants to variables of the second model;
    wherein said determining the portion comprises:
        for substantially each invariant of the first unbounded model, generating a counterpart invariant candidate with respect to the second model, wherein the counterpart invariant candidate is generated using said mapping; and
    utilizing the portion of the invariants to check that the second model holds a property.

2. The computer-implemented method of claim 1, wherein the second model is a modified version of the first unbounded model.

3. The computer-implemented method of claim 1, wherein the invariants are generated by a model checker operative to determine invariants of a model being checked.

4. The computer-implemented method of claim 3, wherein the model checker is a SAT-based model checker operative to check a property without unrolling the model.

5. The computer-implemented method of claim 1, wherein the method is utilized in regression verification of a modified model with respect to the property, wherein the second model is the modified model with respect to the first unbounded model.

6. The computer-implemented method of claim 1, wherein said mapping is performed based on an item selected from the group consisting of: labeling of variables and combinatorial logic structures assigned to variables.

7. The computer-implemented method of claim 1, wherein said obtaining the invariants comprises retrieving the invariants from a data storage device, wherein the invariants were determined during model checking of a second property with respect to the first unbounded model.

8. The computer-implemented method of claim 7, wherein during said model checking the first unbounded model is transformed into a reduced first model using reductions, wherein the invariants that were determined during model checking comprise variables of the reduced first model; and said method further comprises:
    constructing invariants with respect to the first unbounded model based on a reconstruction mapping between the reduced first model and the first unbounded model; and
    storing the constructed invariants in the data storage device.

9. The computer-implemented method of claim 7, wherein the second property is the property.

10. The computer-implemented method of claim 1, further comprises:
    obtaining a generalized counter-example with respect to the property and the first unbounded model, wherein the generalized counter-example comprises partial assignments to the variables of to the first unbounded model in a bounded number of cycles, wherein the generalized counter-example refutes the property; and
    wherein said utilizing the portion of the invariants to check that the second model holds the property comprises:

trying to determine satisfying assignments to variables of the second model based on the generalized counter-example, wherein the satisfying assignments hold the portion of the invariants.

11. The computer-implemented method of claim 10, wherein in response to a determination that the generalized counter-example is not useful to refute that the second model holds the property, model checking the second model using the portion of the invariants.

12. The computer-implemented method of claim 10, wherein said trying to determine comprises utilizing a SAT solver to assign values to the variables of the second model in accordance with the second model and the generalized counter-example.

13. An apparatus, having a processing unit, comprising:
an invariant obtainer operative to obtain invariants with respect to a first unbounded model, wherein the invariants are determined based on the first unbounded model;
an invariant verifier operative to determining a portion of the invariants that are invariants with respect to a second model;
a model checker operative to model check that the second model holds a property, wherein the model checker is operative to utilize the portion of the invariants determined by said invariant verifier, wherein the model checker is configured to produce invariants of a model being checked; and wherein the apparatus comprises an invariants storing module operative to store invariants produced by the model checker, whereby the invariant obtainer is able to retrieve previously stored invariants;
a mapping module operative to determine a mapping between variables of the first unbounded model to variables of the second model;
an invariant counterpart generator operative to generate counterpart invariant candidates with respect to the second model based on the invariants and the mapping; and
wherein said invariant verifier is operative to determine a portion of the invariant candidates that are invariants with respect to the second model.

14. The apparatus of claim 13 further comprising a reconstruction module operative to generate a first invariant with respect to a model based on a second invariant with respect to a reduced model, wherein the model is transformed to the reduced model using reductions; whereby invariants of the reduced model are applied to the model.

15. The apparatus of claim 13 adapted for performing regression verification of a modified model with respect to the property, wherein the second model is the modified model with respect to the first unbounded model.

16. The apparatus of claim 13, further comprising:
a generalized counter-example obtainer operative to obtain a generalized counter-example with respect to the property and the first unbounded model, wherein the generalized counter-example comprises partial assignments to the variables of to the first unbounded model in a bounded number of cycles, wherein the generalized counter-example refutes the property; and
wherein said model checker is operative to try to determine satisfying assignments to variables of the second model based on the generalized counter-example, wherein the satisfying assignments hold the portion of the invariants.

17. A computer program product comprising:
a non-transitory computer readable medium;
a first program instruction for obtaining invariants with respect to a first unbounded model, wherein the invariants are determined based on the first unbounded model;
a second program instruction for determining a portion of the invariants that are invariants with respect to a second model;
a third program instruction for utilizing the portion of the invariants to check that the second model holds a property;
a fourth program instruction for mapping variables of the first unbounded model that are comprised by the invariants to variables of the second model;
wherein determining the portion comprises:
for substantially each invariant of the first unbounded model, generating a counterpart invariant candidate with respect to the second model, wherein the counterpart invariant candidate is generated using the mapping; and
utilizing the portion of the invariants to check that the second model holds a property; and
wherein said first, second, third and fourth program instructions are stored on said non-transitory computer readable medium.

* * * * *